(12) United States Patent
Kitajima et al.

(10) Patent No.: US 6,320,158 B1
(45) Date of Patent: Nov. 20, 2001

(54) METHOD AND APPARATUS OF FABRICATING PERFORATED PLATE

(75) Inventors: Masayuki Kitajima; Yutaka Noda; Yoshitaka Muraoka; Fumihiko Tokura, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/231,485

(22) Filed: Jan. 14, 1999

Related U.S. Application Data

(63) Continuation-in-part of application No. 09/015,265, filed on Jan. 29, 1998, now Pat. No. 6,107,181.

(30) Foreign Application Priority Data

Apr. 21, 1998 (JP) .................................................. 10-110869

(51) Int. Cl.⁷ .................................................. B23K 26/38
(52) U.S. Cl. .................................. 219/121.7; 219/121.71; 219/121.74
(58) Field of Search ........................... 219/121.7, 121.71, 219/121.74, 121.82

(56) References Cited

U.S. PATENT DOCUMENTS

| | | | |
|---|---|---|---|
| 4,027,137 | * | 5/1977 | Liedtke . |
| 4,923,608 | * | 5/1990 | Flottmann et al. . |
| 5,861,323 | * | 1/1999 | Hayes . |

FOREIGN PATENT DOCUMENTS

| | | | | |
|---|---|---|---|---|
| 2271308 | * | 4/1994 | (GB) . | |
| 2236973 | * | 4/1991 | (GB) | ................. 219/121.7 |
| 62-25435 | | 2/1987 | (JP) . | |
| 64-45150 | | 2/1989 | (JP) . | |
| 64-73625 | | 3/1989 | (JP) . | |
| 2-30390 | | 1/1990 | (JP) . | |
| 2-182390 | | 7/1990 | (JP) . | |
| 4-65130 | | 3/1992 | (JP) . | |
| 4-69945 | | 3/1992 | (JP) . | |
| 5-129374 | | 5/1993 | (JP) . | |
| 5-299424 | | 11/1993 | (JP) . | |
| 8-18209 | | 1/1996 | (JP) . | |
| 8-67522 | * | 3/1996 | (JP) . | |
| 8-112671 | | 5/1996 | (JP) . | |
| 8-118005 | | 5/1996 | (JP) . | |
| 8-141765 | | 6/1996 | (JP) . | |
| 9-64048 | | 3/1997 | (JP) . | |
| 9-270429 | | 10/1997 | (JP) . | |
| 9-298355 | | 11/1997 | (JP) . | |
| 9-298356 | | 11/1997 | (JP) . | |
| 63-154282 | * | 6/1988 | (JP) | ................................. 219/121.71 |

OTHER PUBLICATIONS

Office Action of Japanese Patent Appln. No. 10–110869 dated Jan. 5, 1999 with translation.

* cited by examiner

*Primary Examiner*—Geoffrey S. Evans
(74) *Attorney, Agent, or Firm*—Armstrong, Westerman, Hattori, McLeland & Naughton, LLP

(57) ABSTRACT

A method of forming bumps onto a chip having electrodes. The method includes the use of a template having through-holes arranged in correspondence to the electrodes of the chip. The template holds conductive balls to be formed into bumps to the template at the through-holes by vacuum suction. The through-holes of the template are formed by a laser, by supporting a glass plate on a support table having cavities and irradiating the plate with laser beams at the position of the cavities.

9 Claims, 14 Drawing Sheets

METHOD AND APPARATUS OF FABRICATING PERFORATED PLATE

CROSS REFERENCE TO RELATED APPLICATION

This application is a continuation-in-part application of Ser. No. 09/015,265 filed on Jan. 29, 1998, now U.S. Pat. No. 6,107,181.

BACKGROUND OF THE INVENTION

1. Field of the Invention

The present invention relates to a method of forming bumps used for forming conductive bumps on electronic parts. Also, the present invention relates to a method and an apparatus of fabricating a perforated plate which can be used as a template.

2. Description of the Related Art

A method of forming metallic bumps such as solder bumps on an electronic part such as an LSI and joining the electronic part to a printed circuit board by the metallic bumps has come into wide use. In one method of forming the metallic bumps, metallic balls are previously formed and stored in a metallic ball container, and then the metallic balls are taken out from the metallic ball container and attached to the electrodes of the electronic part so that the metallic balls can be used as metallic bumps of the electronic part. For example, Japanese Unexamined Patent publication No. 8-112671 discloses the above-described metallic bump forming apparatus.

In the conventional metallic bump forming apparatus, a suction head is used to take out the metallic balls from the metallic ball container and attach them to the electrodes of electronic part. A template (suction pad) for mounting metallic balls is attached to the suction head, the template having through-holes arranged in the same arrangement as that of the electrodes of the electronic part. Suction grooves are provided in the surface of the sucking head and are connected to a vacuum source, and the through-holes of the template for mounting metallic balls are connected to the suction grooves of the suction head, so that the metallic balls can be attracted by vacuum suction.

When the template for mounting metallic balls comes into contact with the metallic balls accommodated in the metallic ball container, the metallic balls are respectively sucked by and attracted to the through-holes in the template. When the suction head is then moved above the electronic part, the metallic balls attracted to the through-holes in the template are respectively located on the electrodes of the electronic part. Then, the metallic balls are joined to the electrodes of the electronic part under heat and pressure, the metallic balls becoming the metallic bumps. After that, the suction head is separated from the electronic part, with the result that the metallic balls are transferred from the suction head to the electronic part.

The template for mounting metallic balls is usually made of inorganic material such as glass, which is resistant to distortion, and its charging level is low. Plastics are not suitable for the material for the template for mounting metallic balls, because plastics are easily distorted, and their charging level is high. If the template for mounting metallic balls is made of a plate which is easily distorted, the template is distorted and the positions of the through-holes are shifted, from the positions of the electrodes of the electronic parts, when the metallic balls are bonded to the electrodes of the electronic part under heat and pressure by means of thermo-compression. When the template for mounting metallic balls has an electrification property, the metallic balls are attracted to the template at positions other than those of the through-holes by static electricity when the template is moved above and then into the metallic ball container to suck the metallic balls to the through-holes.

Through-holes in the template for mounting metallic balls are formed by etching. Alternatively, the through-holes can be formed by machining such as drilling or electric discharge machining. However, when the template for mounting metallic balls is made of inorganic material such as glass, the side walls of the through-holes become unsmooth, and there is a possibility of generation of burrs which are irregularities of the side walls of the through-holes.

If the side walls of the through-holes are not smooth, the following problems may be caused. The metallic balls bite into the end portions of the through-holes in the template for mounting metallic balls when the template is pressed against the electronic part to join the metallic balls to the electrodes of the electronic part, and the metallic balls adhere to the template and the metallic balls are torn off from the electrodes of the electronic part, when the suction head is separated from the electronic part.

SUMMARY OF THE INVENTION

The object of the present invention is to provide a method of forming bumps onto a chip having electrodes, by which metallic balls can be reliably joined to the electrodes of the semiconductor chip.

Another object of the present invention is to provide a method and an apparatus of fabricating a perforated plate, which can be used as a template for forming metal bumps on the electrodes of the semiconductor chip.

A method of forming bumps onto a chip having electrodes, according to one aspect of the present invention, comprises the steps of: using a template having through-holes formed by a laser, said through-holes being arranged corresponding to the positions of the electrodes of the chip, to attract conductive balls to be formed into bumps to the template at the through-holes by vacuum suction; positioning the conductive balls attracted by the template to the electrodes; pressing the conductive balls against electrodes by the template; and releasing vacuum suction.

A method of fabricating a perforated plate, according to another aspect of the present invention, comprises the steps of: supporting a plate to be processed and including an inorganic material layer on a support table having at least one cavity; and irradiating the plate to be processed with laser beams at the position of said at least one cavity to form a through-hole.

Preferably, the plate to be processed is a glass plate. Preferably, the perforated plate is a template for forming metal bumps on the electrodes of the semiconductor chip.

Preferably, the laser beam is irradiated onto one side of the plate to be processed, the plate to be processed is then reversed, and the laser beam is irradiated onto the other side of the plate to be processed.

Preferably, the perforated plate has a mark such as a letter or a figure.

An apparatus of fabricating a perforated plate, according to another aspect of the present invention, comprises a support table having a surface on which a plate to be processed can be supported, and at least one cavity; and a laser irradiating means for irradiating a laser beam to the plate to be processed at the position of said at least one cavity to form a through-hole.

Preferably, the perforated plate is a template for forming metal bumps on the electrodes of the semiconductor chip.

Preferably, the laser irradiating means is one of an excimer laser and a harmonic YAG laser.

Preferably, the apparatus further comprises a material having a greater transmittance to the laser than that of the plate to be processed arranged in said at least one cavity.

BRIEF DESCRIPTION OF THE DRAWINGS

The present invention will become more apparent from the following description of the preferred embodiments, with reference to the accompanying drawings, in which:

FIGS. 1A and 1B are views showing a process of forming the through-holes in the template, according to the first embodiment of the present invention, wherein FIG. 1A is a cross-sectional view showing the template for mounting metallic balls, and FIG. 1B is a plan view showing a through-hole including a resultant burr;

FIGS. 2A and 2B are views showing a process of irradiating the template shown in FIG. 1 with laser beams, wherein FIG. 2A is a cross-sectional view showing the template for mounting metallic balls, and FIG. 2B is a plan view showing a through-hole from which burr has been removed;

DESCRIPTION OF THE PREFERRED EMBODIMENTS

Figure 5:
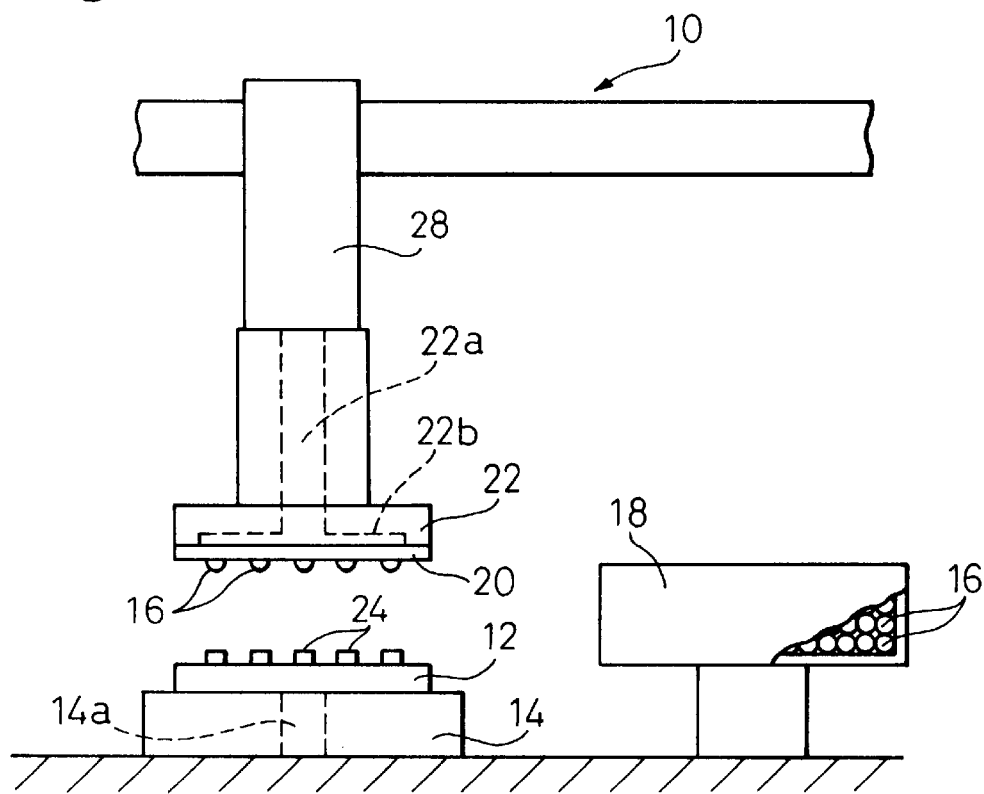
FIG. 5 is a view showing the metallic bump forming apparatus including the template for mounting metallic balls of the present invention.

FIG. 5 shows a metallic bump forming apparatus 10 including a template of the present invention for mounting metallic balls (conductive balls). The metallic bump forming apparatus 10 includes a stage 14 to support an electronic part 12 such as an LSI, a metallic ball container 18 accommodating metallic balls 16 which are previously formed, and a suction head 22 having a template 20 for mounting metallic balls attached thereto.

The stage 14 is provided with a suction hole 14a, so that the electronic part 12 can be held on the stage 14 by the action of a vacuum. The electronic part 12 is provided with electrodes 24 arranged at a predetermined pattern. The suction head 22 is provided with a suction hole 22a and a suction groove 22b.

Figure 6:
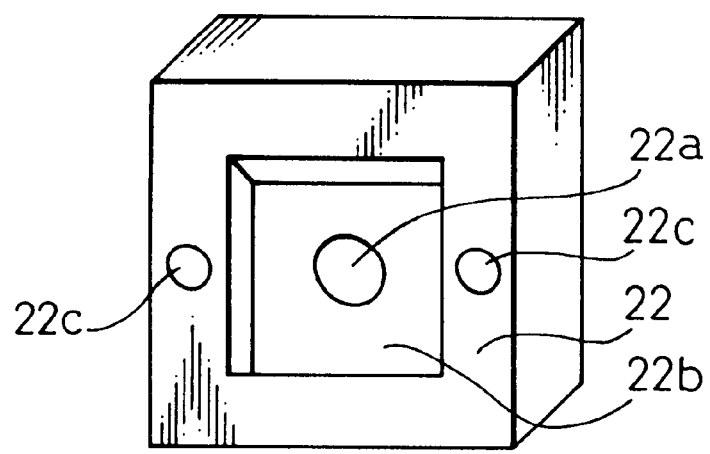
FIG. 6 is a perspective view showing the suction head shown in FIG. 5.

FIG. 6 shows the suction head 22. The suction hole 22a extends in the suction head 22, and the suction groove 22b is formed in the surface of the suction head 22. Also, plate suction holes 22c are open in the surface of the suction head 22.

Figure 7:
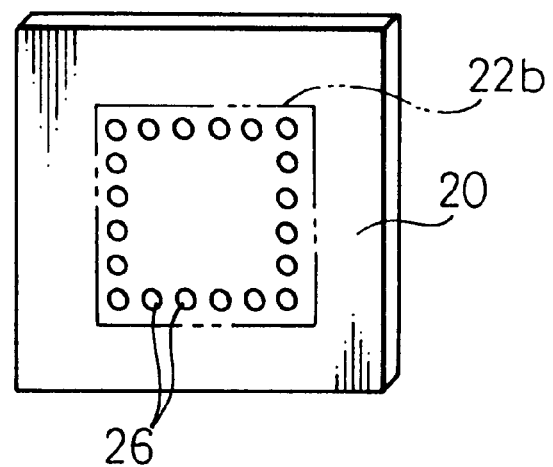
FIG. 7 is a perspective view showing the template shown in FIG. 5 for mounting metallic balls.

FIG. 7 shows the template 20 for mounting metallic balls. The template 20 for mounting metallic balls has through-holes 26. The arrangement of the through-holes 26 is the same as the arrangement of the electrodes 24 of the electronic part 12. According to the type of the electronic part 12, a template 20 having differently arranged through-holes 26 may be prepared. The through-holes 26 are arranged in such a manner that they are located in the range of the suction groove 22b when the template 20 for mounting metallic balls is attracted to the suction head 22 by the plate suction holes 22c. Accordingly, all the through-holes 26 are communicated with the suction groove 22b.

Consequently, it is possible to attract the metallic balls 16 to the through-holes 26 in the template 20 by vacuum suction, as shown in FIG. 5. The metallic bump forming apparatus 10 shown in FIG. 5 further includes a transfer unit 28, so that the suction head 22 can be moved between a position above the metallic ball container 18 and a position above the electronic part 12.

Figure 8A:
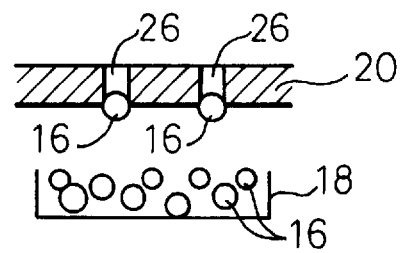
FIGS. 8A to 8E are views showing the operation of the metallic bump forming apparatus.
Figure 8B:
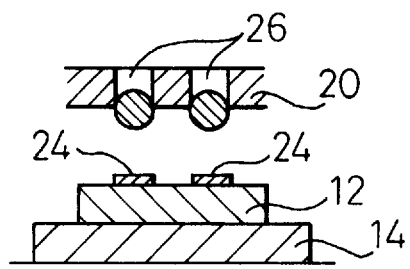
Figure 8C:
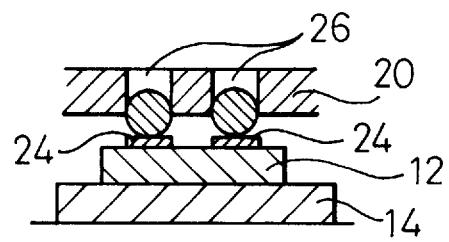
Figure 8D:
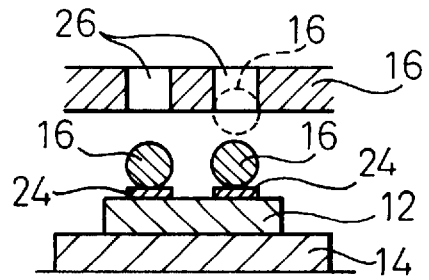
Figure 8E:
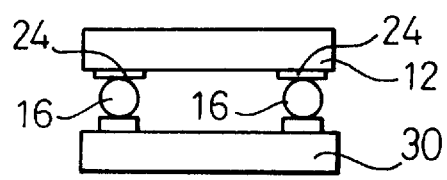

FIGS. 8A to 8E show the operation of the metallic bump forming apparatus 10. FIG. 8A shows a state in which the suction head 22 is moved above the metallic ball container 18 and the metallic balls 16 are attracted to the through-holes 26 in the template 20 by vacuum suction. FIG. 8B shows a state in which the suction head 22 is moved above the electronic part 12 arranged on the stage 14. FIG. 8C shows a state in which the metallic balls 16 are fused to the electrodes 24 of the electronic part 12 under heat and pressure. FIG. 8D shows a state in which the suction head 22 is separated from the electronic part 12. In this case, a vacuum supply to the plate suction holes 22c is continued, and a vacuum supply to the suction hole 22a is stopped. Due to the foregoing, the metallic balls 16 are joined to the electrodes 24 of the electronic part 12 and formed into metallic bumps. After that, it is possible to press the metallic balls 16 against a glass plate so that the metallic balls 16 are leveled, and to apply silver paste to the metallic balls 16. FIG. 8E shows a state in which the electronic part 12 is joined to a printed circuit board 30 by the metallic bumps. In this case, it is possible to bond the electronic part 12 to the printed circuit board 30 with an insulating adhesive.

If the through-holes 26 of template 20 are not smooth, the metallic ball 16 may bite into a burr 42 at the end portion of a through-hole 26 when the template 20 is pressed against the electronic part 12, and the metallic ball 16 may be moved together with the template 20 when the suction head 22 is separated from the electronic part 12, as shown in FIG. 8D, resulting in a problem that the metallic ball 16, which had been joined to the electrodes 24 of the electronic part 12, may be peeled off the electrode 24. Therefore, it is preferable that metallic balls 16 do not bite into the end portions of the through-holes 26.

Figure 1A:
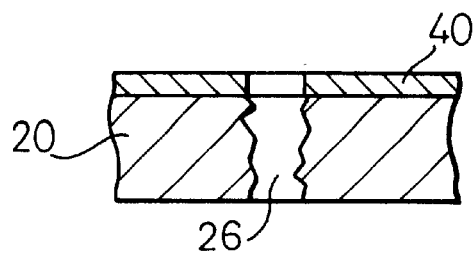
Figure 1B:
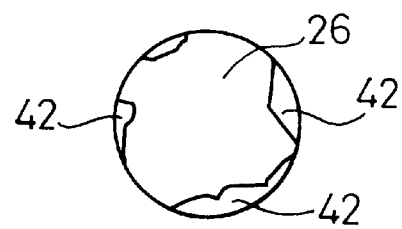

FIGS. 1A to 2B show the first embodiment of the present invention. The template 20 for mounting metallic balls is made of glass which is an inorganic material. In FIG. 1A, a template (glass plate) 20 for mounting metallic balls is subjected to etching to form through-holes 26. In this case, etching is conducted in such a manner that a glass plate with a mask 40 is soaked in the etching liquid containing fluoride. When the through-holes 26 are formed in the glass plate by etching, the side walls of the through-holes 26 become irregular, as shown in FIG. 1(B), that is, burrs 42 are formed in the side walls of the through-holes 26.

Figure 2A:
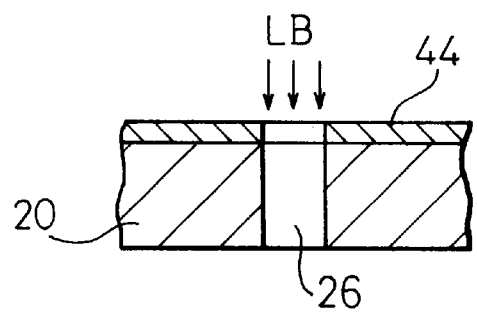
Figure 2B:
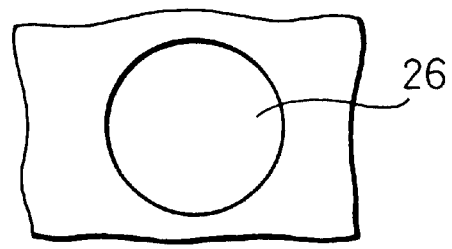

The side walls of the through-holes 26 are then smoothed, by irradiating the side walls of the through-holes with laser beams LB, as shown in FIG. 2A. FIG. 2B diagrammatically shows the through-hole 26 in which the burr 42 is removed from the side wall of the through-hole 26 shown in FIG. 1B and the side wall is smoothed.

It is preferable that only a restricted region in the periphery of the through-hole 26 is irradiated with laser beams LB. If a portion between two adjacent through-holes 26 in the template 20 is excessively irradiated with laser beams LB, a problem occurs that the surface of the template 20 may be deformed. It is preferable to use an excimer laser. The intensity of energy emitted by the YAG laser is so high that it is not appropriate when fine perforation is to be conducted. The $CO_2$ laser is not appropriate for processing a glass plate.

In this example, the template 20 is irradiated with laser beams LB after the mask 44 has been set on it. In the case where the diameter of the through-hole 26 is 24 $\mu$m, the diameter of the opening of the mask 44 is 26 $\mu$m. In other words, it is preferable that laser beams LB is irradiated at a region larger than the diameter of the through-hole 26 by 2 $\mu$m. In this example, the output condition of the laser was as follows: when the thickness of the template 20 is 300 $\mu$m, the output is 300 mJ/200 Hz, and the number of pulses is 1000. Also, krypton gas and fluorine gas are used. In this case, He gas or Ne gas is added as an assist gas. As a pretreatment, carbon (C) is vapor-deposited to the glass plate.

Figure 3:
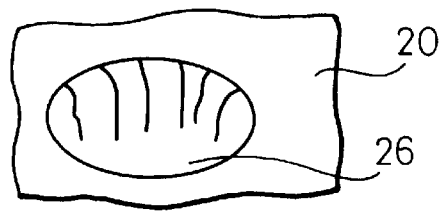
FIG. 3 is a schematic perspective view showing the periphery of the end portion of the through-hole which is smoothed by the irradiation of laser beams.

FIG. 3 shows the end portion (a portion of the through-hole 26 close to the surface of the template 20 for mounting metallic balls) of the through-hole 26 which has been made smooth by the irradiation of laser beams LB. Burr 42 shown in FIG. 1(B) in the through-hole 26 formed when etching is conducted is melted away and the surface of the through-hole 26 becomes smoother. In this connection, a state in which the burr 42 is formed in the through-hole 26 and also a state in which the burr 42 is removed from the through-hole 26, as shown in FIG. 3, can be seen by the microscopic observation and microphotograph.

Figure 4:
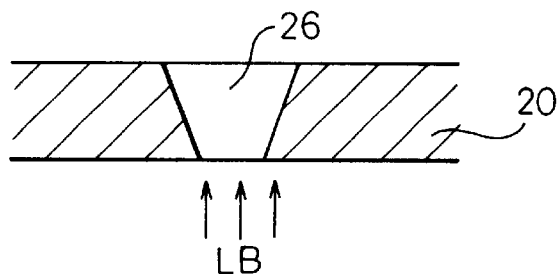
FIG. 4 is a cross-sectional view showing a variation of the template for mounting metallic balls.

In FIG. 1A, the diameter of the through-hole 26 in the template 20 is substantially uniform, but FIG. 4 shows an example in which the through-hole 26 in the template 20 is tapered. When the through-hole 26 is formed in the template 20 by etching, the through-hole 26 is frequently tapered, as shown in FIG. 5. Burrs are caused also in this case too, so the side wall of the through-hole 26 is irradiated with laser beams LB to smooth the side wall of the through-hole. In this case, one end portion of the through-hole 26, the diameter of which is smaller than that of the other end portion, is irradiated with laser beams LB, and in use, this end portion irradiated with laser beams LB is directed toward the metallic ball 16.

In the above example, the through-holes 26 in the template 20 for mounting metallic balls are formed by etching, but it is possible to form the through-holes 26 by machining such as electric discharge drilling, and after the formation of the through-holes 26, they are irradiated with laser beams LB.

Figure 9:
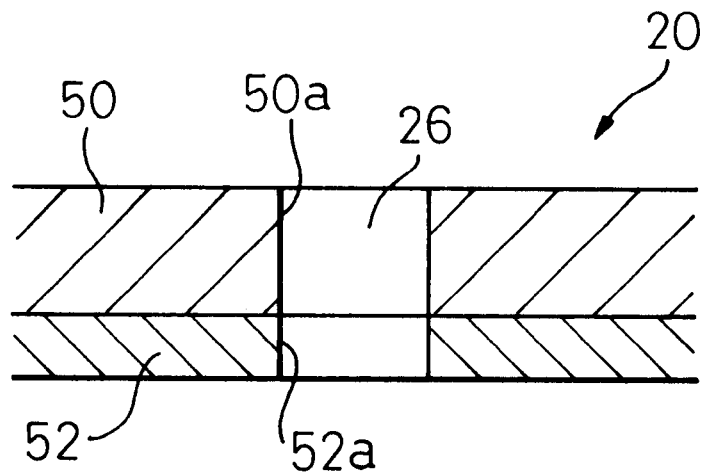
FIG. 9 is a cross-sectional view showing a portion of the template for mounting metallic balls, according to the second embodiment of the present invention.

FIG. 9 shows the second embodiment of the present invention. In this embodiment, the template 20 for mounting metallic balls comprises an inorganic material layer 50 and an organic material layer 52 laminated on each other, and the through-holes (only one shown in FIG. 9) 26 (50a, 52a) to attract and support the metallic balls 16 are formed through the inorganic material layer 50 and the organic material layer 52. The organic material layer 52 is bonded to the inorganic material layer 50 by prepreg or adhesive.

The inorganic material layer 50 comprises a glass plate, and the through-holes 50a are formed by etching. The inorganic material layer 50 provides a necessary high mechanical strength to the template 20 for mounting metallic balls. The organic material layer 52 is made of a heat-resistant plastic such as polyimide, fluorine resin of PTFE, or nylon. The smooth through-holes 50a can be easily formed in the organic material layer 52 by laser beam processing, compared with the case in which the through-holes 50a are formed in the inorganic material layer 50. In use, the through-holes 52a are directed to the metallic balls 16.

Accordingly, the mechanical strength of the template 20 comprising the inorganic material layer 50 and the organic material layer 52 is sufficiently high, the metallic balls 16 do not bite into the through-holes 26, and it is possible to reliably form metallic bumps in the electronic part, using this template 20 for mounting metallic balls. In this connection, the inorganic material layer 50 and the organic material layer 52 may be bonded together after the through-holes 50a, 52b have been respectively formed, or alternatively the through-hole 26 may be formed after both layers have been bonded together. The surface of the organic material layer 52 may be coated with a film for preventing the generation of static electricity.

Figure 10:
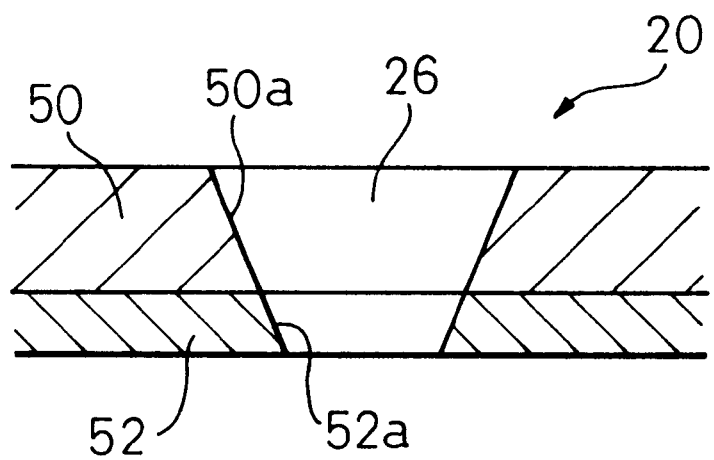
FIG. 10 is a cross-sectional view showing a variation of the template for mounting metallic balls shown in FIG. 9.

FIG. 10 shows a variation of the template 20 shown in FIG. 9. The through-holes 26 in this template 20 are tapered. Except for this point, the template 20 shown in FIG. 10 is the same as that shown in FIG. 9.

Figure 11:
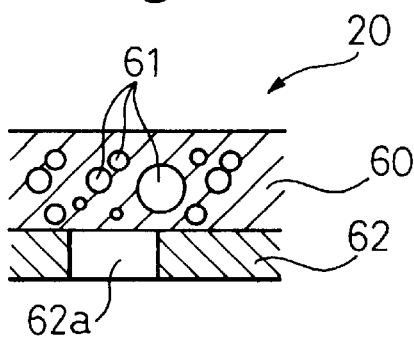
FIG. 11 is a cross-sectional view showing a portion of the template for mounting metallic balls, according to the third embodiment of the present invention.
Figure 12:
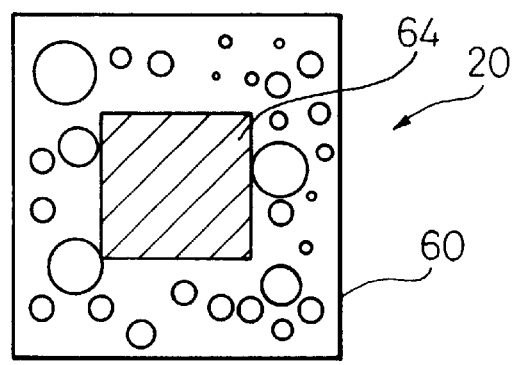
FIG. 12 is a plan view showing the air permeable material layer of the template for mounting metallic balls shown in FIG. 11.
Figure 13:
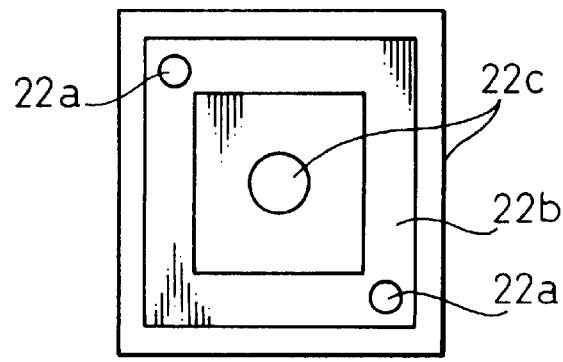
FIG. 13 is a plan view showing the suction head used with the template shown in FIGS. 11 and 12 for mounting metallic balls.

FIGS. 11 to 13 show the third embodiment of the present invention. As shown in FIG. 11, the template 20 comprises an air permeable material layer 60 and a resin layer 62 laminated on each other, and the through-holes (only one shown in FIG. 11) 62a is formed in the resin layer 62. The air permeable material layer 60 and the resin layer 62 are bonded to each other. The air permeable material layer 60 is made of a porous material having a sufficient mechanical strength, or a fibrous material such as glass fiber, so that, air can pass through the air permeable material layer 60. In the structure shown in FIG. 11, the air permeable material layer 60 comprises a plate of a porous material, and fine holes 61 are formed in the plate.

FIG. 12 shows the air permeable material layer 60 of the template 20 for mounting metallic balls. An impermeable holding member 64 is arranged on the surface of the air permeable material layer 60 at the center thereof on the opposite side to the resin layer 62.

FIG. 13 shows the suction head 22. The suction head 22 includes suction holes 22a, a suction groove 22b, and a plate suction hole 22c. The plate suction hole 22c is arranged at the center of the suction head 22 to attract the holding member 64 provided on the air permeable material layer 60, to thereby attract the entire template 20. The suction groove 22b is formed in the annular shape around the plate suction hole 22c, and the suction holes 22a are open to the inside of the suction groove 22b. The through-holes 62a in the resin layer 62 are arranged in the region of the suction groove 22b.

Accordingly, the mechanical strength of the template 20 comprising the air permeable material layer 60 and the resin layer 62 is sufficiently high, and the metallic balls 16 do not bite into the through-holes 62a, so that it is possible to reliably form metallic bumps on the electronic part, using this template 20 for mounting metallic balls. In this connection, the air permeable material layer 60 and the resin layer 62 may be bonded to each other after the through-holes 62a have been formed, or alternatively the through-hole 62a may be formed after both layers have been bonded to each other.

Figure 14A:
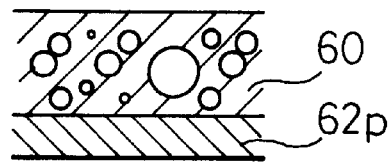
FIGS. 14A to 14C are views showing an example of the manufacturing of the template for mounting metallic balls shown in FIG. 11.
Figure 14B:
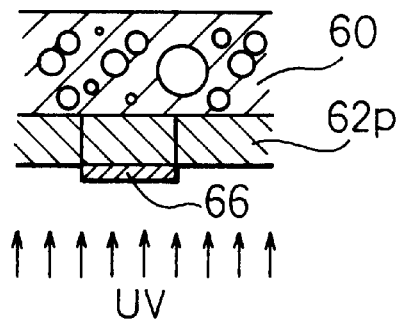
Figure 14C:
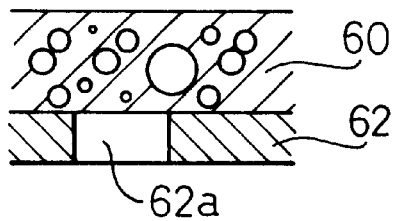

FIGS. 14A to 14C show an example in which the through-holes 62a are formed after the air permeable material layer 60 and the resin layer 62 are bonded onto each other. FIG. 14A shows a state in which the surface of the air permeable material layer 60 is coated or impregnated with an ultraviolet-ray curable resin 62p. FIG. 14B shows a state in which a mask 66 is formed on the ultraviolet-ray curable resin 62p at positions where the through-holes 62a are to be formed and the ultraviolet-ray curable resin 62p is irradiated with ultraviolet rays (UV). FIG. 14C shows a state in which an unmasked portion of the ultraviolet-ray curable resin 62p exposed to ultraviolet-rays is hardened, and a masked portion of the ultraviolet-ray curable resin 62p not exposed to ultraviolet-rays is not hardened, the unhardened portion being removed by solvent, so that the resin layer 62 having the through-holes 62a is formed.

Figure 15:
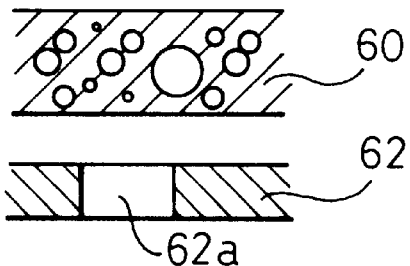
FIG. 15 is a view showing another example of the manufacturing of the template for mounting metallic balls shown in FIG. 11.

FIG. 15 shows an example in which the air permeable material layer 60 and the resin layer 62 are bonded onto each other after the through-holes 62a have been formed in the resin layer 62.

Figure 16:
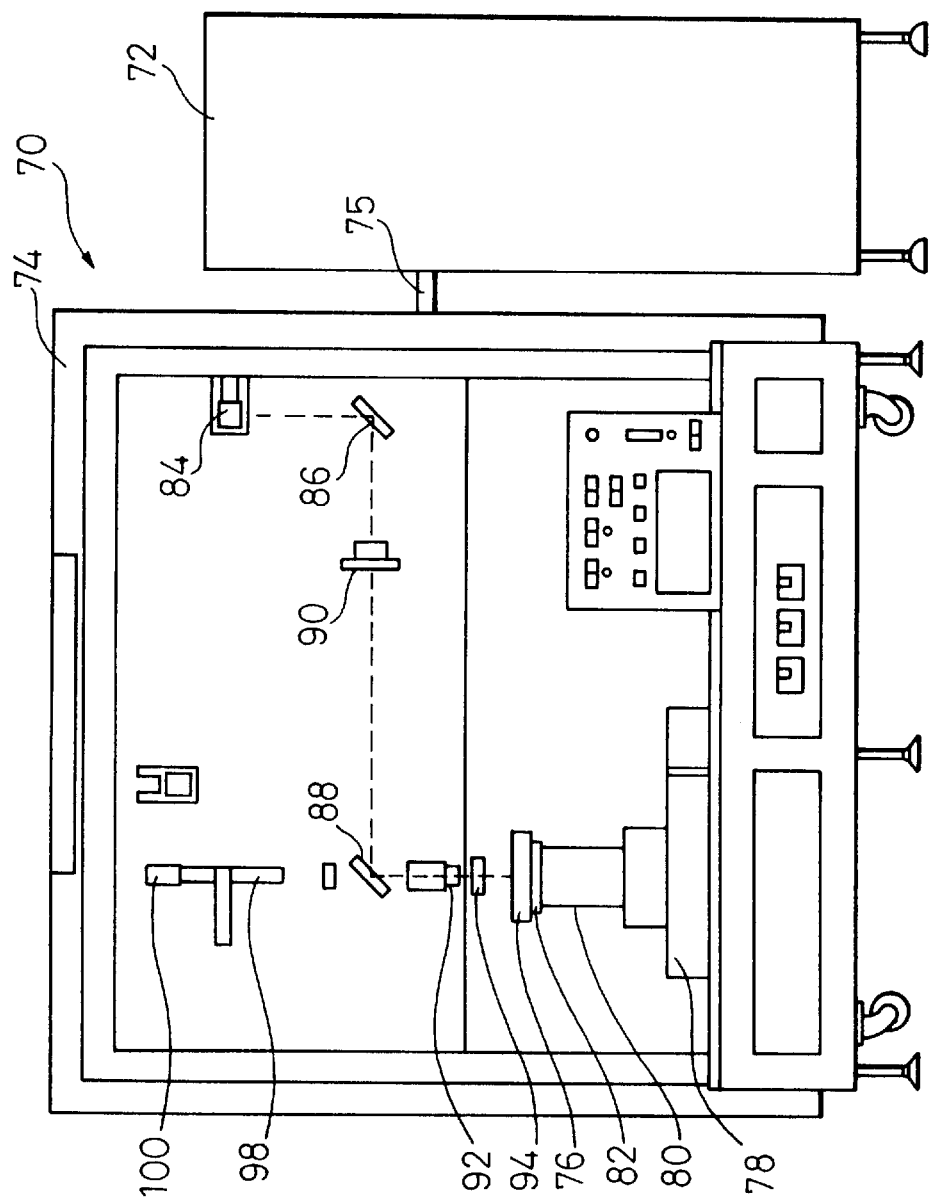
FIG. 16 is a side view showing an apparatus of fabricating a template for forming metal bumps on the electrodes of the semiconductor chip according to the fourth embodiment of the present invention.

FIGS. 16 to 27 show the fourth embodiment of the present invention. FIG. 16 shows an apparatus 70 for fabricating a template (perforated plate) 20 for forming metal bumps on electrodes of a semiconductor chip, which is used in the fourth embodiment of the present invention. The apparatus 70 includes a laser generating part 72, and a laser processing or machining part 74. The laser generating part 72 in this embodiment is an excimer laser unit. The laser beam generated in the laser generating part 72 is supplied to the laser processing part 74 via a guide conduit 75.

The laser processing part 74 includes a support table 76 for supporting a plate 102 (FIG. 17) to be processed or machined to form the template 20, an X-Y stage 78, a Z stage 80, and a θ stage 82. The Z stage 80 is attached to the X-Y stage 78, and the θ stage 82 is attached to the Z stage 80. The support table 76 is attached to the θ stage 82. Also, a not shown φ stage is provided, and the support table 76 is supported so that it can move in five directions.

The laser processing part 74 also includes mirrors 84, 86 and 88, a mask holder 90, a reducing lens 92, and a ring illumination device 94. The laser processing part 74 is arranged such that the laser beam generated supplied from the laser generating part 72 to the laser processing part 74 via the guide conduit 75 is guided to the mirror 84. The laser beam is reflected by the mirrors 84, 86 and 88 and directed to the plate 102 on the support table 76.

The mask holder 90 holds a mask (not shown) to adjust the size of a spot of the laser beam. The reducing lens 92 functions to reduce the laser beam to the greatest degree at the plate 102 on the support table 76. Therefore, it is possible to form a through-hole by the energy of the laser beam prevailing in the central region thereof, even if the laser processing surface is shifted from the reducing projecting position and a projected image is not obtained. The mirrors 84, 86 and 88 are movably arranged so that the travelling path of the laser beam can be changed. The laser processing part 74 also includes a microscope 98 and a CCD camera 100. The plate 102 on the support table 76 can be observed by the microscope 98 and the CCD camera 100.

Figure 17:
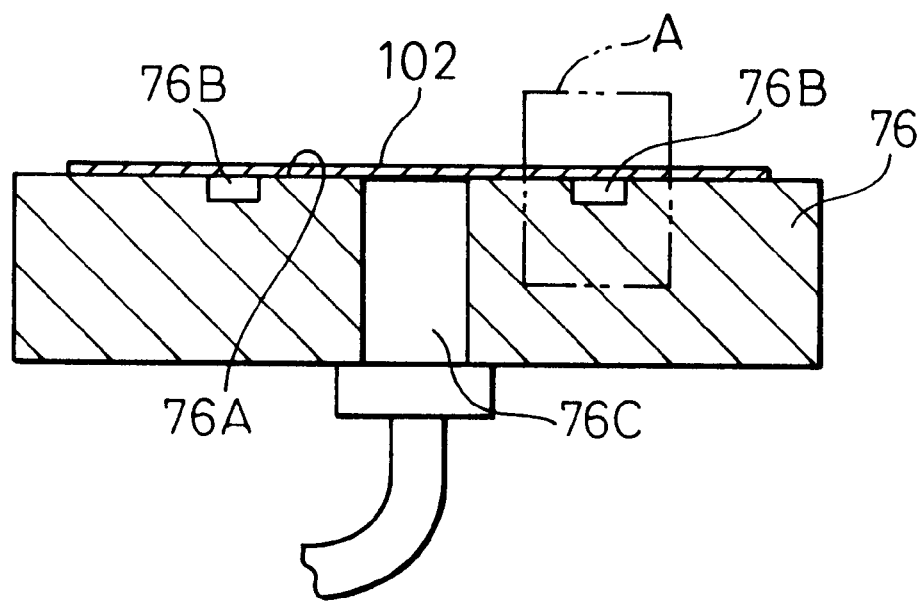
FIG. 17 is a cross-sectional view, in an enlarged scale, showing a portion of the supporting plate of FIG. 16.
Figure 18:
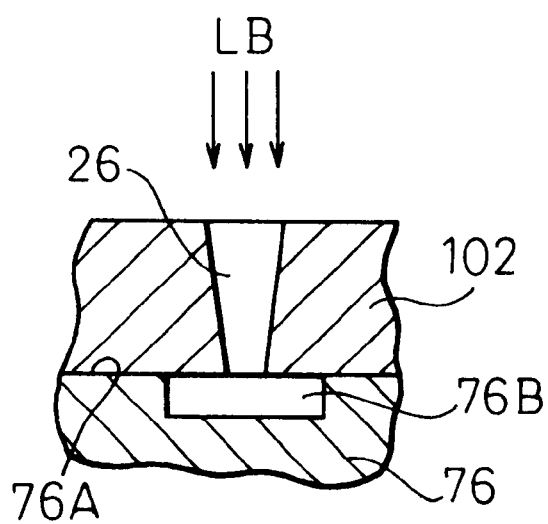
FIG. 18 is a cross-sectional view of a portion A of FIG. 17.

FIG. 17 is an enlarged view of the support table 76 of FIG. 16, and FIG. 18 is an enlarged view of the portion A of FIG. 17. The support table 76 has a surface 76A on which the plate 102 can be rested, cavities 76B arranged in the surface 76A, and a vacuum hole 76C to attract the plate 102 by vacuum. The surface 76A is flat so that the plate 102, attracted by vacuum, can be closely held in a flat position. The cavities 76B are arranged corresponding to the positions of the through-holes 26 to be formed, i.e., the positions of the bumps.

FIG. 18 shows the step in which the plate 102 to be processed is supported by the support table 76 and the laser beam LB is irradiated to form the through-holes 26. The laser beam LB is irradiated onto the plate 102 at the position of the cavity 76B. In the present invention, the through-holes 26 are formed in the glass plate 102 to be processed by applying the laser beam. The thickness of the glass plate 102 to be processed is 0.3 mm, and the diameter of the through-holes 26 is equal to or smaller than 30 μm. The laser beam is focused on the surface of the plate 102 to be processed.

It is not generally possible to form through-holes in a glass plate having such a thickness. That is, a glass plate generally transmits light, so a sufficient energy to form a through-hole is not absorbed even if the laser beam is irradiated onto such glass plate. In the present invention, it becomes possible to form the through-holes 26 in the glass plate 102, by selecting a glass for the plate 102 which can absorb a light having a wavelength in the range of ultraviolet beam, and by irradiating a laser beam having a wavelength in the range of ultraviolet beam.

It is preferable that a glass having ultraviolet beam absorptance of more than 90 percent is used as a glass which can absorb a light having a wavelength in the range of ultraviolet beam, and borosilicate glass (such as Pyrex), a green glass and a white glass can be used for this purpose. A quartz glass has a lower ultraviolet beam absorptance (a higher transmittance), and it is not suitable for forming a through-holes by applying the ultraviolet beam. An excimer laser and a harmonic YAG laser can be used as an example of a laser beam having a wavelength in the range of ultraviolet beam. In the available excimer lasers, ArF laser has the wavelength of 194 nm, KrF laser has the wavelength of 248 nm, and XeF laser has the wavelength of 308 nm. In the available harmonic YAG laser, a four times harmonic YAG (FHG-YAG) laser has the wavelength of 266 nm.

In this way, it is possible to directly pierce the through-holes 26 in the glass plate 102 (template 20 for forming metal bumps on electrodes of a semiconductor chip), by irradiating the laser beam LB. It is possible to appropriately determine the irradiating condition of the laser beam LB, depending on the thickness of the plate 102 and the diameter of the through-hole 26. One example of the laser irradiating condition is identical to the laser irradiating condition used in the case of smoothening the side wall of the through-hole 26 of the template 20 after the through-hole 26 is formed by etching, as described with reference to FIG. 2. However, the time period necessary for directly piercing the through-hole 26 in the glass plate 102 by irradiating the laser beam is longer than that that necessary for the smoothing process.

However, when the through-hole 26 of the glass plate 102 is formed by irradiating the laser beam LB, particles caused by the cutting process may adhere to the end of the through-hole 26 on the side at which the laser beam LB is irradiated. If the support table 76 has no cavities 76B, the laser beam LB passing through the through-hole 26 is reflected by the surface 76A of the support table 76, so that the end of the through-hole 26 on the side opposite to the side at which the laser beam LB is irradiated will be roughened and cracks may be caused in the wall of the support table 76 around the through-hole 26.

By arranging the cavity 76B in the support table 76, the laser beam LB passing through the through-hole 26 is not reflected by the surface 76A of the support table 76, the end of the through-hole 26 on the side opposite to the laser irradiation side is prevented from being roughened, and the wall of the support table 76 around the through-hole 26 is kept smooth. The cavity 76B is formed in such a shape and a size that the through-hole 26 is not roughened by the laser beam LB passing through the through-hole 26 and reflected by the surface 76A of the support table 76. For example, the area of the cavity 76B is preferably equal to or greater than that of the through-hole 26, and more preferably, approximately two times the area of the through-hole 26. The depth of the cavity 76B is preferably equal to or greater than 0.1 mm, and more preferably, approximately 0.5 mm. In addition, small depressions and small projections are provided in the surface (bottom surface and side surface) of the cavity 76B for diffusing the laser beam LB passing through the plate 102.

Therefore, in the formation of the bumps, the glass plate 102 having the through-holes 26 formed in this way is used as the template 20 for forming metal bumps on electrodes of a semiconductor chip, and the metallic balls 16 are reliably attached to the electrodes 24 of the electronic device 12 while the metallic balls 16 are held by suction by the through-holes 26 of the template 20. In this case, the end of the through-hole 26 on the side opposite to the side at which the laser beam Lb is irradiated is smooth, so it is advisable to use this end of the through-hole 26 to suck and hold the metallic ball 16.

Figure 19A:
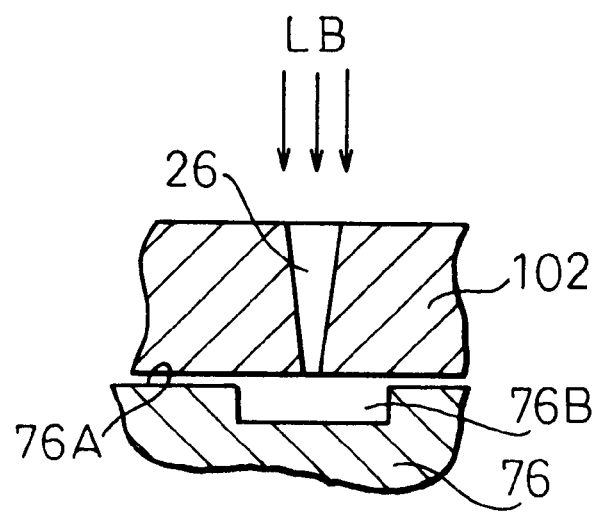
FIGS. 19A and 19B are cross-sectional views showing a variant example for forming the through-holes of FIG. 18.
Figure 19B:
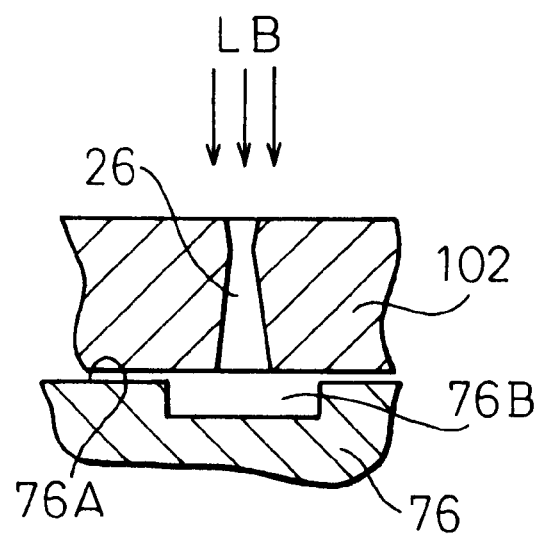

FIGS. 19A and 19B show a variant example for forming the through-holes of FIG. 18. In the formation of the through-hole 26, the laser beam LB is irradiated onto the glass plate 102 from one side thereof to form the through-hole 26, as shown in FIG. 19A. In this case, the hole 26 may not be a completely pierced through-hole but it may be a partially pierced hole. The glass plate 102 is then reversed and the laser beam LB is irradiated onto the glass plate 102 from the other side thereof, as shown in FIG. 19B. Accordingly, it is possible to suitably shape the end of the through-hole 26 on the side at which the metallic ball 16 is to be sucked (lower end in FIG. 19A), and to prevent the end of the through-hole 26 on the side at which the laser beam is first irradiated (lower end in FIG. 19B) from becoming excessively large.

Figure 20:
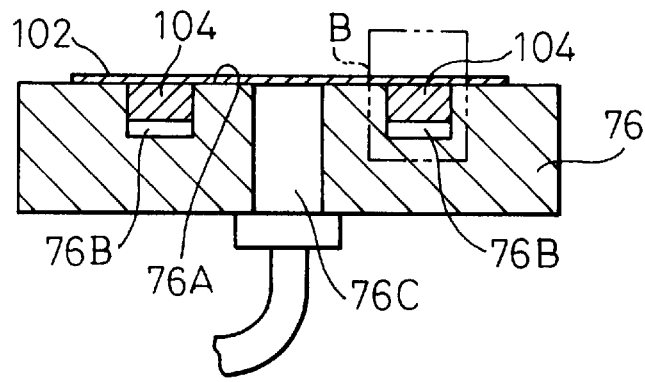
FIG. 20 is a cross-sectional view showing a further variant example for forming the through-holes.
Figure 21:
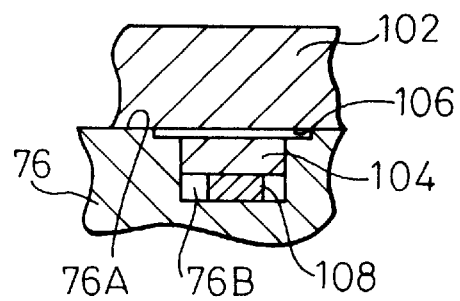
FIG. 21 is a cross-sectional view of a portion B of FIG. 20.
Figure 22:
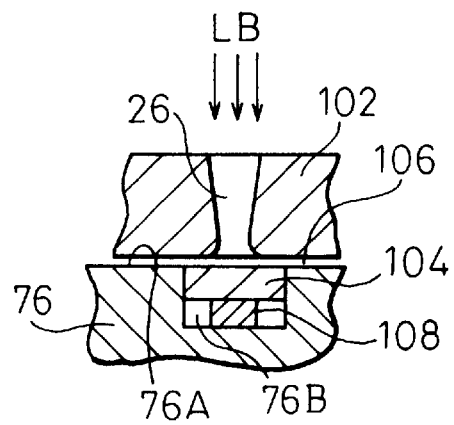
FIG. 22 is a cross-sectional view, similar to FIG. 21, but showing the through-hole forming operation.

FIGS. 20 to 22 show a further variant example for forming the through-holes. FIG. 20 shows a part of a support table 76 corresponding to a part of the support table 76, and this support table 76 can be used as the support table 76 of FIG. 16. FIG. 21 is an enlarged view of a portion B of FIG. 20, and FIG. 22 shows the same portion of FIG. 21 when the through-hole 26 is formed.

The support table 76 has a surface 76A on which the plate 102 to be processed can be rested, cavities 76B arranged in the surface 76A, and a vacuum hole 76C to attract the plate 102 by vacuum. The surface 76A is flat so that the plate 102 attracted by vacuum can be closely held in a flat position. The cavities 76B are arranged corresponding to the positions of the through-holes 26 to be formed, i.e., the positions of the bumps.

In addition, an insert 104 of a quartz glass is arranged in the cavity 76. The quartz glass has a higher transmittance for the laser beam than that of the plate 102 to be processed. For example, the plate 102 has an ultraviolet beam absorptance of more than 90 percent, while the insert 104 of a quartz glass has ultraviolet beam transmittance of more than 90 percent and its reflectance is very low. The insert 104 is carried by the cavity 76B in such a manner that an appropriate small gap 106 exists between the plate 102 and the insert 104. The insert 104 can be held by a support projection 108 or the like so as to form the gap 108, but otherwise the insert 104 can be carried by the wall of the cavity 76B by friction.

In the cutting process of the through-holes 26, the laser beam LB is irradiated onto the glass plate 102 from one side thereof to form the through-hole 26, as shown in FIG. 22. The through-hole 26 can be formed in a similar manner to the above described example, but since the insert 104 of a quartz glass is arranged in the cavity 76B, the laser beam LB, which passes through the plate 102 into the cavity 76B and does not pass through the insert 104 of a quartz glass, processes a portion of the plate 102 around the cavity 76B. Therefore, the portion of the plate 102 around the cavity 76B is smoothly rounded, as shown in FIG. 22, and the rounded portion is relatively shallow. This shape is quite advantageous in sucking and attracting the metallic ball 16. The gap 106 is to be determined by the condition of the laser beam LB, and an excessively large (too wide) gap or an excessively small (too narrow) gap is not preferable. If the insert 104 is made of metal, almost all the laser beam LB acts on the plate 102, so the portion of the plate 102 around the cavity 76B may be excessively machined and roughened, as described above.

Figure 23:
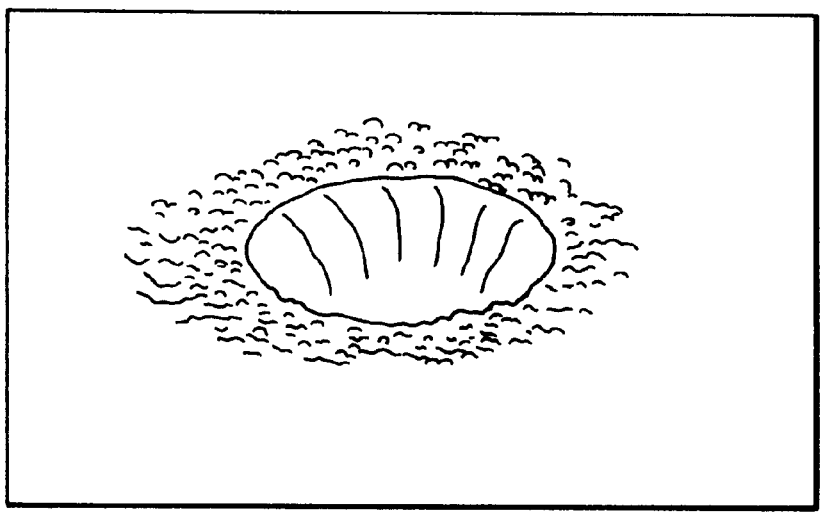
FIG. 23 is a perspective view showing the end portion of the through-hole formed by the method of FIGS. 20 to 22, on the side at which the laser beams are irradiated.
Figure 24:
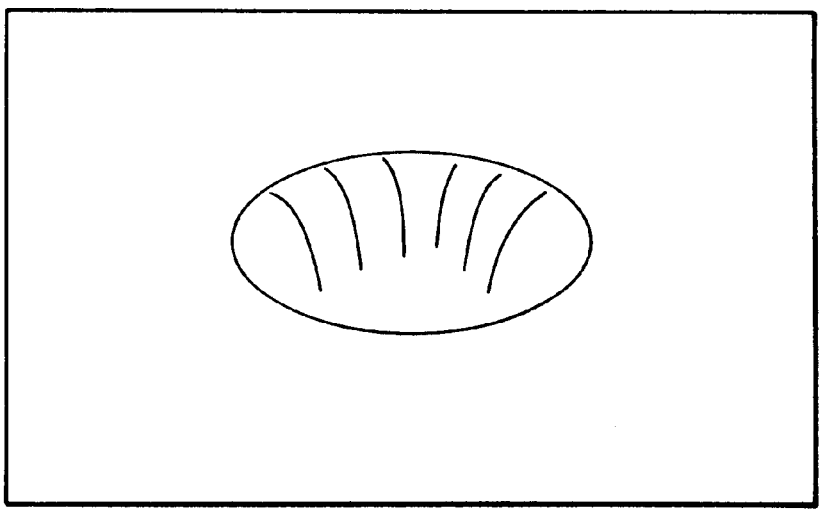
FIG. 24 is a perspective view showing the end portion of the through-hole on the opposite side from the laser irradiation side.

FIG. 23 shows the end of the through-hole 26 on the side at which the laser beam LB is irradiated, and FIG. 24 shows the end of the through-hole 26 on the side opposite to the laser irradiation side. These figures are drawn based on the photographs. The laser used is an excimer laser (the wavelength λ=248 nm), and the diameter of the machined hole is 30 μm. Further, in all the embodiments, it is preferable to wash or clean the plate 102 with an organic solvent or a strong acid solvent to remove foreign matters and projections attached to the inner surface of the through-hole 26 or to smoothen the portion around the through-hole 26.

Figure 25:
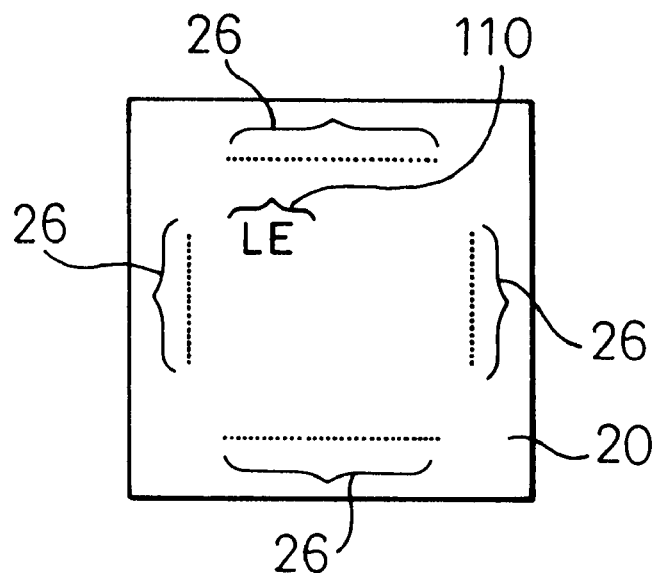
FIG. 25 is a plan view showing the surface of the template for forming metal bumps on the electrodes of the semiconductor chip with through-holes formed by the irradiation of the laser beams.
Figure 26:
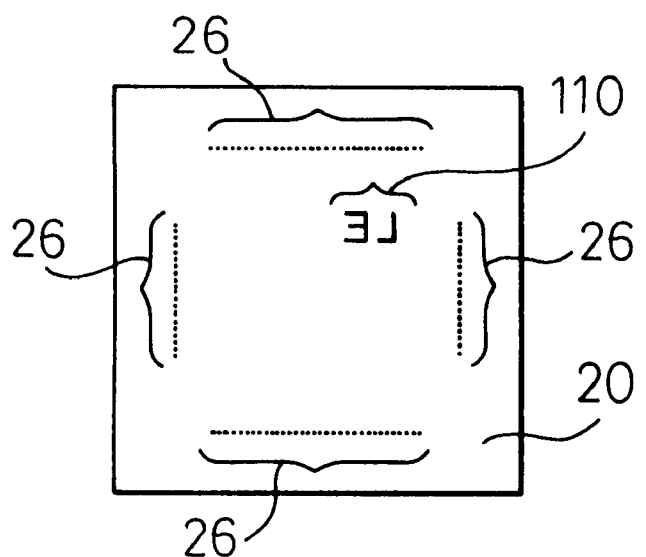
FIG. 26 is a plan view showing the opposite surface of the same template.

FIG. 25 shows the surface of the template 20 for forming the bumps on the electrodes of the semiconductor chip, the template 20 having through-holes 26 formed by irradiating the laser beam LB. FIG. 26 shows the reverse surface of the same template 20. The surface of the template 20 has a mark 110 such as a letter or a figure engraved therein, whereby the surface of the template 20 can be easily distinguished from the reverse surface of the template 20. This mark 110 can be observed and read by the microscope 98 and the CCD camera 100 of FIG. 16. If this mark 110 is arranged in the surface of the template 20 on the side at which the metallic balls 16 are sucked and attracted, there is a possibility that the metallic balls 16 are stucked to the engraved grooves or the like, so the engraving is preferably arranged in the surface of the template 20 on the side opposite to the ball attracting side.

Figure 27:
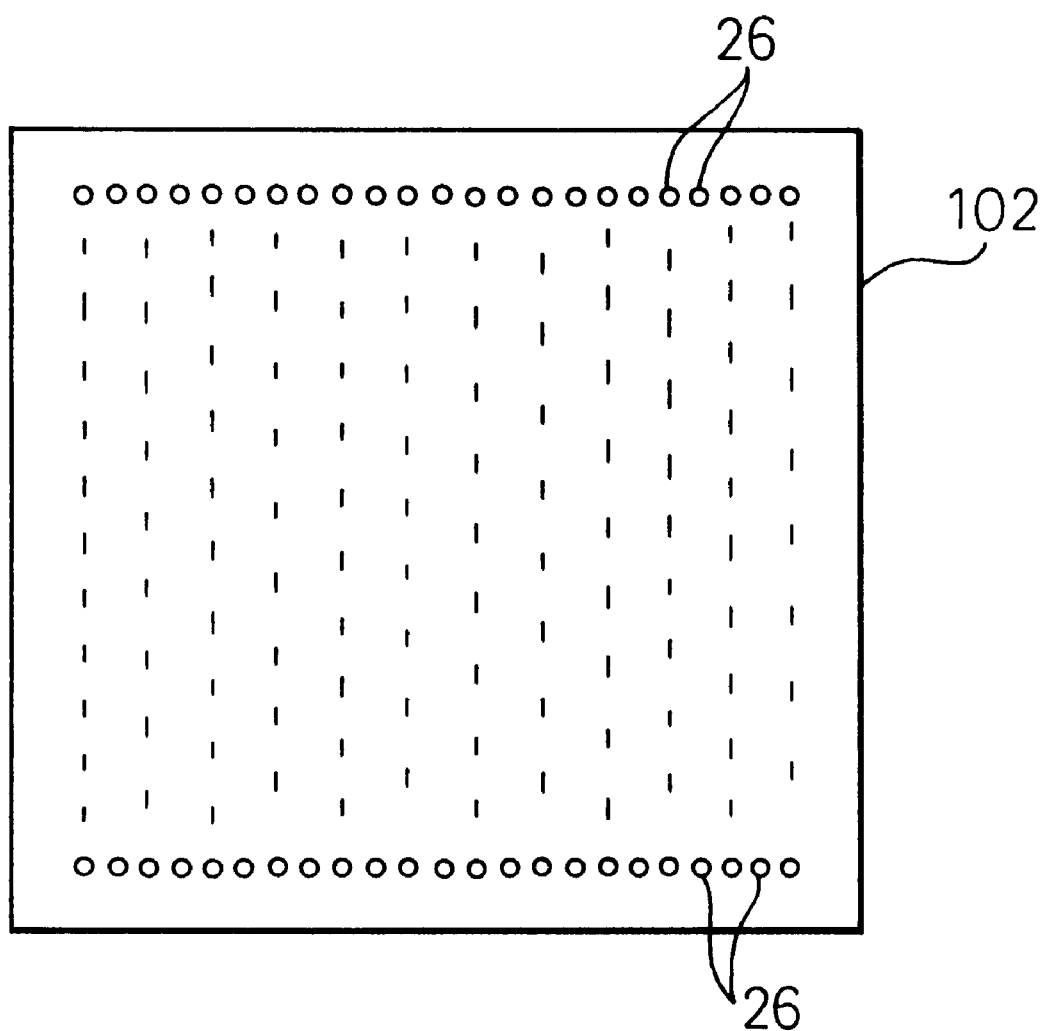
FIG. 27 is a plan view showing an example of a perforated plate used as a filter member having through-holes formed by the irradiation of the laser beams.

The plate 102, which is made from an inorganic material such as glass and has through-holes 26 formed by irradiating the laser beam LB, can be used, as a perforated plate, in applications other than the template 20 for forming metal bumps on electrodes of a semiconductor chip. For example, FIG. 27 shows an example in which the plate 102 is used as a filtering plate. It is possible to form many small through-holes 26 having the diameter of, for example, 10 μm by irradiating the laser beam onto the glass plate, and the resultant plate can be as a filtering plate.

According to the present invention, it is possible to provide a template for mounting metallic balls, having through-holes, the surfaces of which are smooth and no burr is caused on the surface. Therefore, metallic bumps can be easily and reliably formed on the electronic part. Further, the reliability of the connecting sections can be enhanced, and the structure of the metallic bump forming apparatus and also the structure of the electronic part joining machine can be simplified. Furthermore, the quality and productivity of the metallic bumps can be enhanced by the present invention. In addition, it is possible to obtain a perforated plate having through-holes, by irradiating the laser beam to the glass plate. The time period necessary to fabricate the perforated plate by the irradiation of the laser beam is two times or more shorter than that necessary to fabricate a similar perforated plate by etching, and the fabrication is efficient.

What is claimed is:

1. A method of fabricating a perforated plate, said method comprising the steps of:

supporting a plate to be processed and including an inorganic material on a movable support table having a flat surface and a plurality of cavities having bottoms; and irradiating the plate to be processed with a laser beam at the positions of said cavities having bottoms to form through-holes.

2. A method according to claim 1, wherein said plate to be processed is a glass plate.

3. A method according to claim 1, wherein said perforated plate is a template for forming metal bumps on the electrodes of the semiconductor chip.

4. A method according to claim 1, wherein the laser beam is irradiated onto one side of the plate to be processed, the plate to be processed is then reversed, and the laser beam is irradiated onto the other side of the plate to be processed.

5. A method according to claim 1, wherein said perforated plate has a mark.

6. An apparatus of fabricating a perforated plate, said apparatus comprising:

a movable stage;

a support table placed on said movable stage, said support table having a flat surface on which a plate to be processed can be supported, and a plurality of cavities in said flat surface, said cavities having bottoms; and a laser irradiating means for irradiating a laser beam to the plate to be processed at the position of said cavities to form through-holes.

7. An apparatus according to claim 6, wherein said perforated plate is a template for forming metal bumps on the electrodes of the semiconductor chip.

8. An apparatus according to claim 6, wherein said laser irradiating means is one of an excimer laser and a harmonic YAG laser.

9. An apparatus according to claim 6, further comprising a material having a greater transmittance to the laser than that of the plate to be processed arranged in said cavities.

* * * * *